US010255963B2

(12) United States Patent
Shido

(10) Patent No.: US 10,255,963 B2
(45) Date of Patent: Apr. 9, 2019

(54) APPARATUS HAVING DICE TO PERFORM REFRESH OPERATIONS

(71) Applicant: Micron Technology, Inc., Boise, ID (US)

(72) Inventor: Taihei Shido, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/979,057

(22) Filed: May 14, 2018

(65) Prior Publication Data
US 2018/0261273 A1 Sep. 13, 2018

Related U.S. Application Data

(60) Division of application No. 15/431,383, filed on Feb. 13, 2017, now Pat. No. 10,008,254, which is a continuation of application No. 14/714,962, filed on May 18, 2015, now Pat. No. 9,570,142.

(51) Int. Cl.
G11C 7/00 (2006.01)
G11C 11/406 (2006.01)
G11C 11/4076 (2006.01)
G11C 7/22 (2006.01)
G11C 11/4093 (2006.01)
G11C 11/408 (2006.01)

(52) U.S. Cl.
CPC ............ G11C 11/406 (2013.01); G11C 7/222 (2013.01); G11C 11/4076 (2013.01); G11C 11/4087 (2013.01); G11C 11/4093 (2013.01); G11C 11/40603 (2013.01)

(58) Field of Classification Search
CPC ... G11C 11/406; G11C 11/4076; G11C 7/222; G11C 11/40603; G11C 11/4093; G11C 11/4087

USPC ............ 365/222, 193, 233.1, 233.11, 233.12
See application file for complete search history.

(56) References Cited

U.S. PATENT DOCUMENTS

| 7,296,754 | B2 | 11/2007 | Nishizawa et al. |
| 7,466,577 | B2* | 12/2008 | Sekiguchi ............... G11C 5/02 257/686 |
| 7,623,365 | B2 | 11/2009 | Jeddeloh |
| 7,872,936 | B2 | 1/2011 | Blankenship |
| 7,929,368 | B2 | 4/2011 | Jeddeloh |
| 8,233,303 | B2 | 7/2012 | Best et al. |

(Continued)

FOREIGN PATENT DOCUMENTS

WO WO-2016187221 A1 11/2016

OTHER PUBLICATIONS

"High Bandwidth Memory (HBM) DRAM", JEDEC Standard, JESD235, JEDEC Solid State Technology Association, (Oct. 2013), 124.

(Continued)

Primary Examiner — Viet Q Nguyen
(74) Attorney, Agent, or Firm — Schwegman Lundberg & Woessner, P.A.

(57) ABSTRACT

Some embodiments include an apparatus that comprise an interface chip having an oscillator to produce an original clock signal, a first memory chip having first memory cells, and a second memory chip having second memory cells. The first memory cells may be refreshed in response to a first clock signal based on the original clock signal. The second memory cells may be refreshed in response to a second clock signal based on the original clock signal.

15 Claims, 13 Drawing Sheets

(56) References Cited

U.S. PATENT DOCUMENTS

| | | | |
|---|---|---|---|
| 8,310,382 B2 | 11/2012 | Ide et al. | |
| 8,473,653 B2 | 6/2013 | Kondo et al. | |
| 8,498,831 B2 | 7/2013 | Ide | |
| 8,547,767 B2 | 10/2013 | Ruckerbauer et al. | |
| 8,593,899 B2 | 11/2013 | Ide | |
| 8,693,230 B2* | 4/2014 | Kondo | G11C 5/02 365/233.12 |
| 8,799,730 B2 | 8/2014 | Oh et al. | |
| 8,873,325 B2 | 10/2014 | Sakakibara et al. | |
| 8,885,380 B2 | 11/2014 | Kang et al. | |
| 8,988,962 B2 | 3/2015 | Shin et al. | |
| 9,076,548 B1 | 7/2015 | Park et al. | |
| 9,087,614 B2 | 7/2015 | Son et al. | |
| 9,218,854 B2 | 12/2015 | Stephens | |
| 9,225,331 B2 | 12/2015 | Kondo | |
| 9,312,031 B2* | 4/2016 | Nishioka | G11C 16/20 |
| 9,432,298 B1 | 8/2016 | Smith | |
| 9,570,142 B2* | 2/2017 | Shido | G11C 11/4076 |
| 9,670,142 B2 | 6/2017 | Tsaklakidis et al. | |
| 2008/0028137 A1 | 1/2008 | Schakel et al. | |
| 2009/0237970 A1* | 9/2009 | Chung | G11C 5/02 365/51 |
| 2010/0091537 A1 | 4/2010 | Best et al. | |
| 2011/0085403 A1 | 4/2011 | Nishioka | |
| 2011/0271158 A1 | 11/2011 | Jeddeloh | |
| 2012/0254472 A1 | 10/2012 | Ware et al. | |
| 2012/0263003 A1 | 10/2012 | Sakakibara et al. | |
| 2014/0006699 A1 | 1/2014 | Bains et al. | |
| 2014/0237177 A1* | 8/2014 | Yu | G11C 11/40607 711/106 |
| 2014/0327150 A1 | 11/2014 | Jung et al. | |
| 2014/0328104 A1 | 11/2014 | Jeon et al. | |
| 2015/0001717 A1 | 1/2015 | Karhade et al. | |
| 2015/0098289 A1* | 4/2015 | Saito | G11C 11/40603 365/222 |
| 2015/0162068 A1 | 6/2015 | Woo et al. | |
| 2015/0187408 A1 | 7/2015 | Kim | |
| 2016/0118105 A1* | 4/2016 | Shido | G11C 11/4093 365/189.05 |
| 2016/0133314 A1 | 5/2016 | Hwang et al. | |
| 2016/0343423 A1 | 11/2016 | Shido | |
| 2017/0154663 A1 | 6/2017 | Shido | |
| 2017/0358336 A1* | 12/2017 | Shido | G11C 7/22 |
| 2018/0025789 A1* | 1/2018 | Dono | G11C 29/38 714/719 |
| 2018/0151207 A1* | 5/2018 | Kondo | G11C 7/1039 |

OTHER PUBLICATIONS

"International Application Serial No. PCT/US2016/032912, International Preliminary Report on Patentability dated Nov. 30, 2017", 8 pgs.

"International Application Serial No. PCT/US2016/032912, International Search Report dated Aug. 8, 2016", 3 pgs.

"International Application Serial No. PCT/US2016/032912, Written Opinion dated Aug. 8, 2016", 6 pgs.

"Taiwanese Application Serial No. 105114778, Office Action dated Apr. 20, 2017", w/ Translation and English Pending Claims, 16 pgs.

"Taiwanese Applicatian Serial No. 105114778. Respense filed Oct. 24, 2017 to Office Action dated Apr. 20, 2017", w/English Claims, 22 pgs.

U.S. Appl. No. 14/714,962, Non Final Office Action dated Feb. 3, 2016, 11 pgs.

U.S. Appl. No. 14/714,962, Response filed May 3, 2016 to Non Final Office Action dated Feb. 3, 2015, 9 pgs.

U.S. Appl. No. 14/714,962, Notice of Allowance dated Jun. 15, 2016, 8 pgs.

U.S. Appl. No. 14/714,962, Notice of Allowance dated Oct. 3, 2016, 9 pgs.

U.S. Appl. No. 15/431,383, Restriction Requirement dated Apr. 4, 2017, 7 pgs.

U.S. Appl. No. 15/431,383, Response filed Jun. 5, 2017 to Restriction Requirement dated Apr. 4, 2017, 6 pgs.

U.S. Appl. No. 15/431,383, Non Final Office Action dated Jul. 6, 2017, 7 pgs.

U.S. Appl. No. 15/431,383, Response filed Nov. 6, 2017 to Non Final Office Action dated Jun. 6, 2017, 6 pgs.

U.S. Appl. No. 15/431,383, Notice of Allowance dated Feb. 7, 2018, 8 pgs.

U.S. Appl. No. 15/431,383, Corrected Notice of Allowance dated Feb. 27, 2018, 2 pgs.

* cited by examiner

APPARATUS HAVING DICE TO PERFORM REFRESH OPERATIONS

PRIORITY APPLICATION

This application is a divisional of U.S. application Ser. No. 15/431,383, filed Feb. 13, 2017, which is a continuation of U.S. application Ser. No. 14/714,962, filed May 18, 2015, now issued as U.S. Pat. No. 9,570,142, all of which are incorporated herein by reference in their entireties.

BACKGROUND

Some semiconductor devices, such as a DRAM (Dynamic Random Access Memory), perform a refresh operation to restore charge in memory cells to maintain the stored state of logical data. In general, the refresh operation is performed on a periodic basis or on a command basis with regard to a single die of DRAM. When a plurality of dice are involved, operations are more complex, such that current consumption and stability become more difficult to control.

SUMMARY

According to a first aspect of the invention, a apparatus includes an interface chip including an oscillator producing an original clock signal, a first memory chip including a first terminal configured to receive a first clock signal in response to the original clock signal, a second terminal supplied with a first control signal, and first memory cells that are subject to a data refresh operation in response to the first clock signal when the first control single is active, and a second memory chip including a third terminal configured to receive a second clock signal in response to the original clock signal, a fourth terminal supplied with a second control signal, and second memory cells that are subject to a data refresh operation in response to the second clock signal when the second control signal is active.

According to a second aspect of the invention, a apparatus includes a chip stack structure including first and second memory chips stacked over each other, and an interface chip coupled to the chip stack structure. The first memory chip includes first and second terminals and a plurality of first memory cell. The second memory chip includes third, fourth and fifth terminals. The first and second memory chips are stacked over each other such that the second terminal of the first memory chip is electrically connected to the fifth terminal of the second memory chip. The interface chip includes sixth, seventh, and eighth terminals, and is coupled to the chip stack structure such that the sixth, seventh and eighth terminals of the interface chip are electrically connected to the third, fourth and fifth terminals of the second memory chips, the second terminal is coupled to a first command decoder circuit of the first memory chip, and the fourth terminal is coupled to a second command decoder circuit of the second memory chip. The first and second command decoder circuits work independently from each other.

According to a third aspect of the invention, an apparatus includes an interface chip that includes an oscillator circuit to provide an oscillator signal, a first memory chip on which a first refresh operation is performed in response to a first refresh enable signal supplied at a first node and a first oscillator enable signal supplied at a second node, a second memory chip on which a second refresh operation is performed in response to a second refresh enable signal supplied at a third node and a second oscillator enable signal supplied at a fourth node. The first and third nodes are configured to receive from the interface chip the first and second refresh enable signals independently of each other. The second and fourth nodes are configured to receive, based on the oscillator signal, the first and second oscillator enable signals in different timings from each other so that the first and second refresh operations are performed in different timings from each other even when the first and third nodes receive the first and second refresh enable signals simultaneously.

DETAILED DESCRIPTION

The description that follows includes illustrative an apparatus including semiconductor devices (circuits, systems, and the like) and processes (e.g., timing, waveforms, and the like) that embody the disclosed subject matter. In the following description, for purposes of explanation, numerous specific details are set forth in order to provide an understanding of various embodiments of the subject matter.

Figure 1:
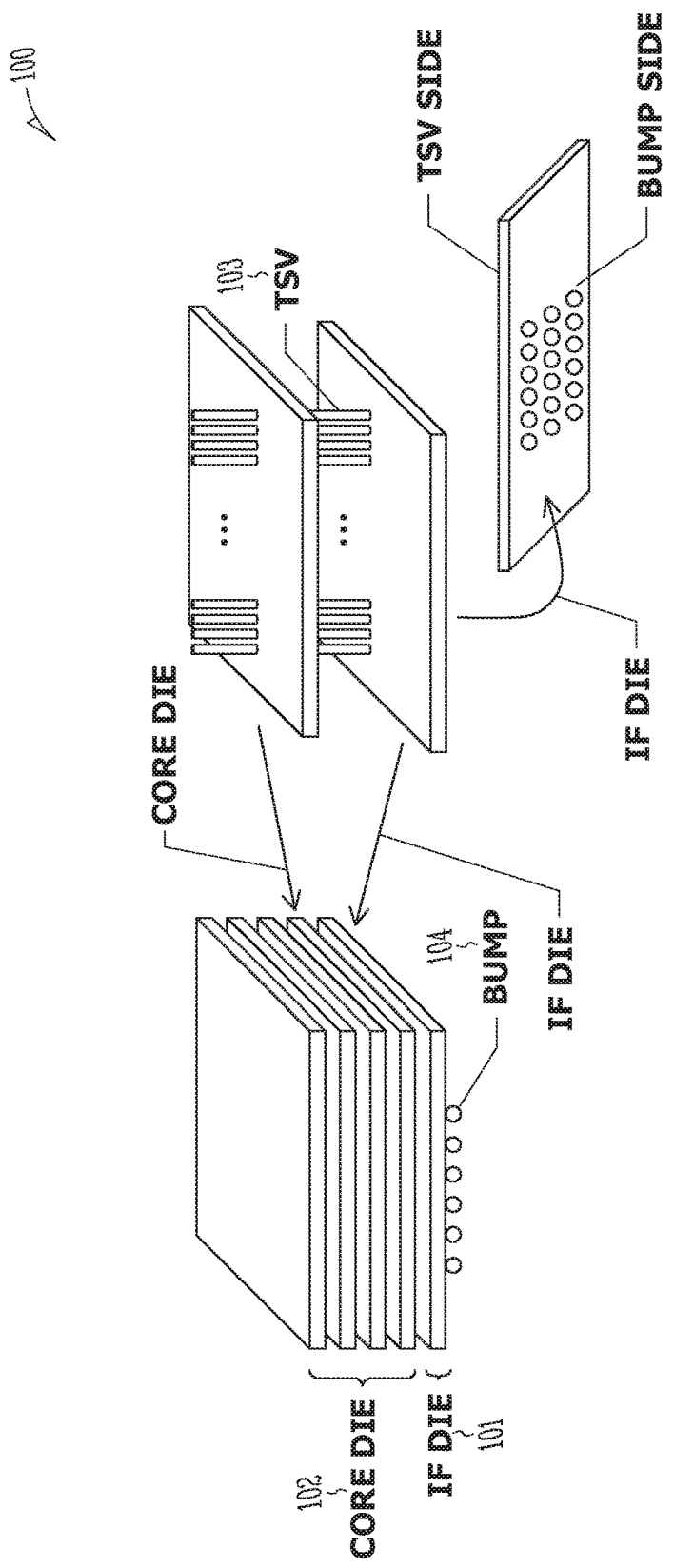
FIG. 1 illustrates an example of a high bandwidth memory according to a first embodiment.

FIG. 1 illustrates an example of a high bandwidth memory (HBM) according to a first embodiment. The HBM 100 may include an interface die 101, a stack of core dice 102 over the interface die 101, through-silicon-vias (TSVs) 103 to connect the core dice 102 with each other, and bump pads 104, and the HBM 100 may include a high band width memory explained below for example by referring to FIGS. 7, 8, 12, and 13.

Figure 7:
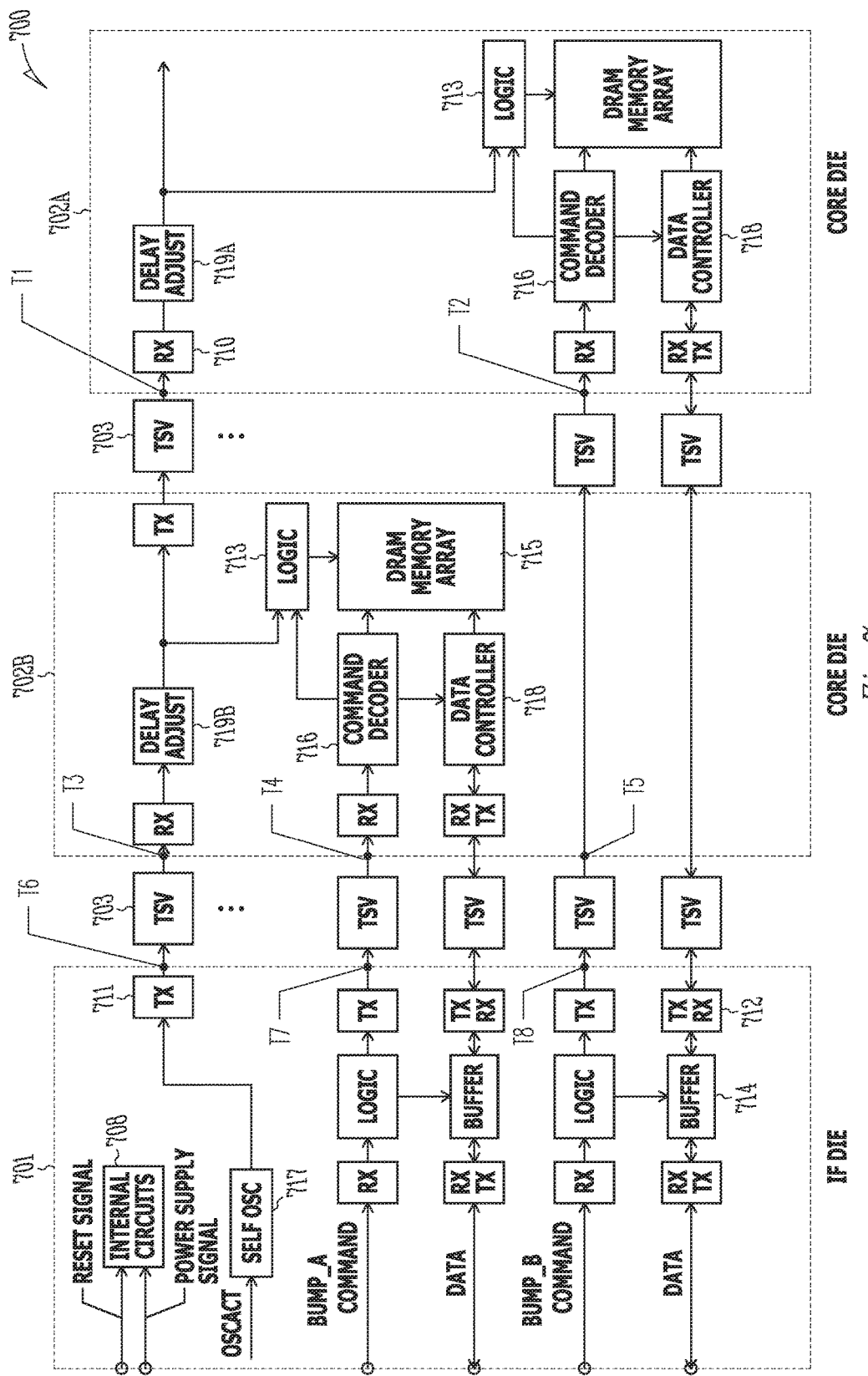
FIG. 7 illustrates an example of a high bandwidth memory according to the first embodiment.

In some embodiments, the bump pads 104 may include micro bumps 104, and may receive signals from a host controller (not shown). The interface die 101 may buffer signals from the bumps 104 to the TSVs 103. In some embodiments, the core dice 102 may include memory cells, while the interface die 101 may not include any memory cells. In some embodiments, the core dice 102 may include one or more command decoders (such as a command decoder 116 as shown in FIG. 7).

In some embodiments, the interface die 101 may be divided into some independent channels. These channels may be independent of one another. The HBM 100 may have a wide data interface that may perform an operation with a high-speed and low-power-consumption. A self-refresh operation may be performed in the HBM 100.

Figure 2:
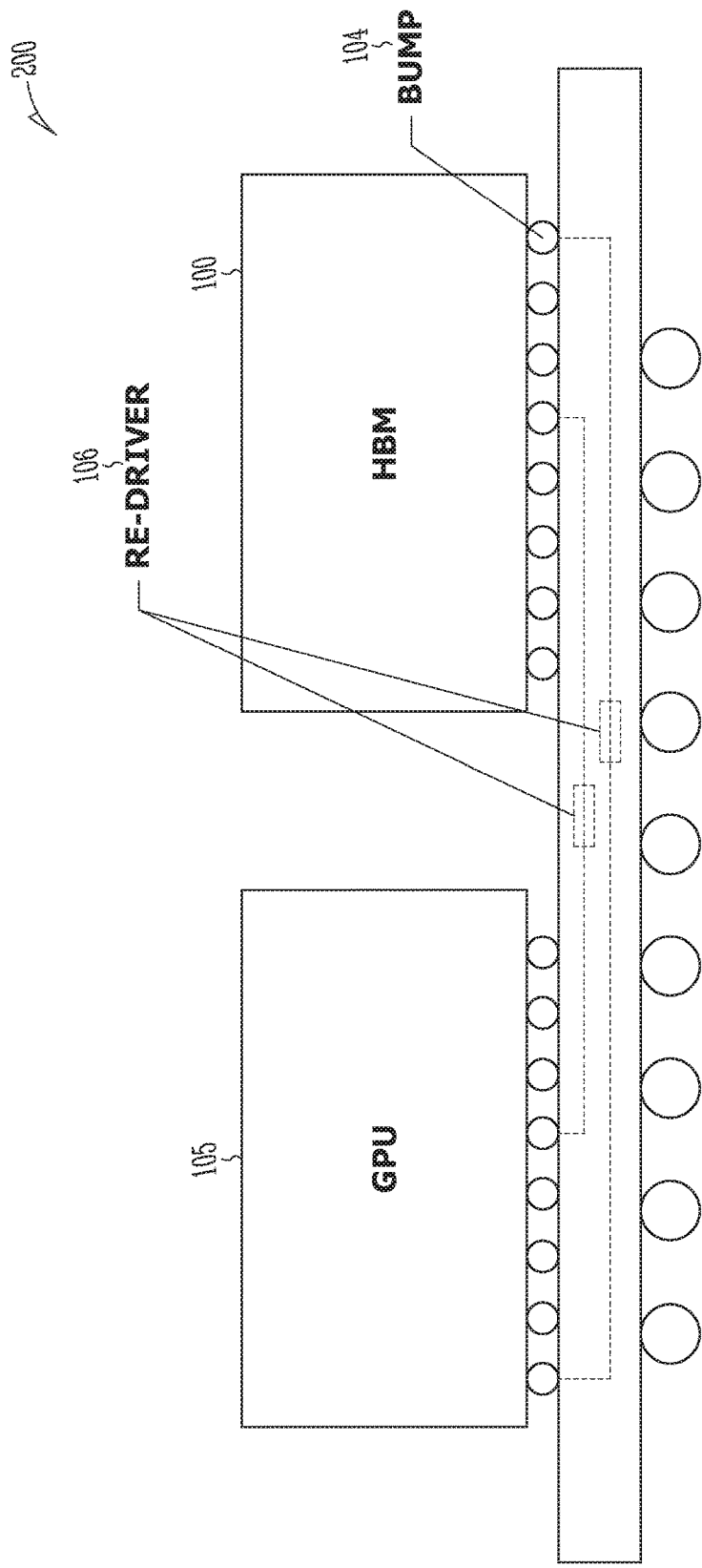
FIG. 2 illustrates an example structure having a high bandwidth memory and a graphics processing unit according to the first embodiment.
Figure 3:
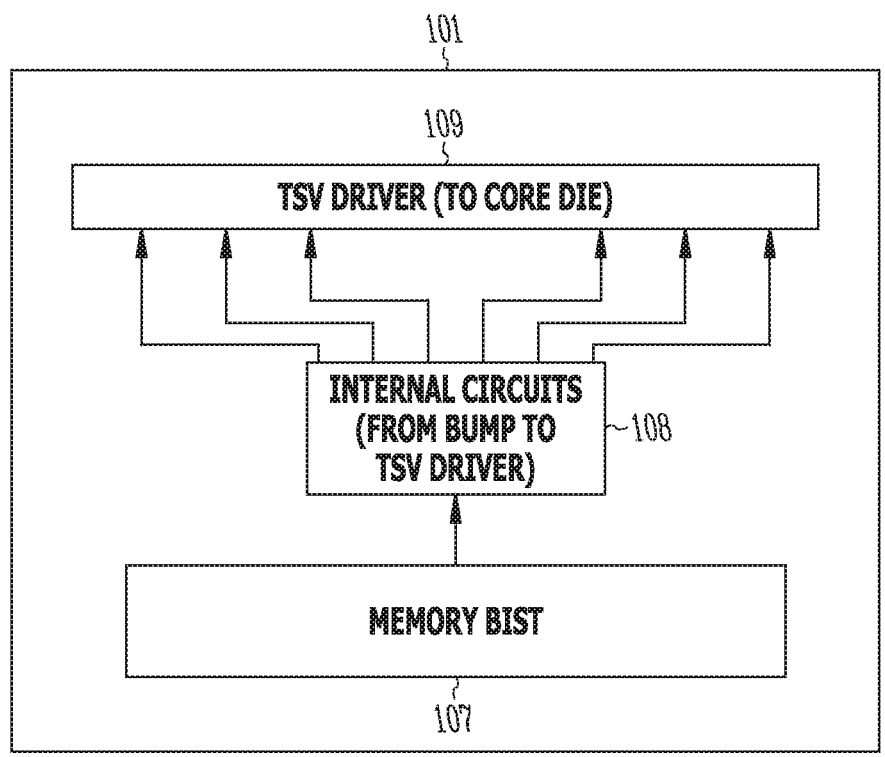
FIG. 3 illustrates an example of the circuitry of the interface die according to the first embodiment.

FIG. 2 illustrates an example structure 200 including a HBM 100 and a Graphics Processing Unit (GPU) 105 according to the first embodiment. In some embodiments, a re-driver 106 may be disposed between the HBM 100 and the GPU 105 to drive a signal. The structure 200 may be called as a semiconductor device, an apparatus, or a system, that is accessed via a connection portion by a controller (not shown) or a processor (not shown). The connecting portion may be a bump, a ball, or a solder ball. FIG. 3 illustrates an example of the circuitry of the interface die 101 according to the first embodiment. In some embodiments, the circuitry of the interface die 101 may include a memory Built-In-Self-Test (BIST) circuit 107 to test the core die 102, internal circuits 108 (as shown in FIG. 4 for example), and an input buffer 109 to receive signals from a corresponding micro bumps 104 and to convey the signals to corresponding TSVs 103.

Figure 4:
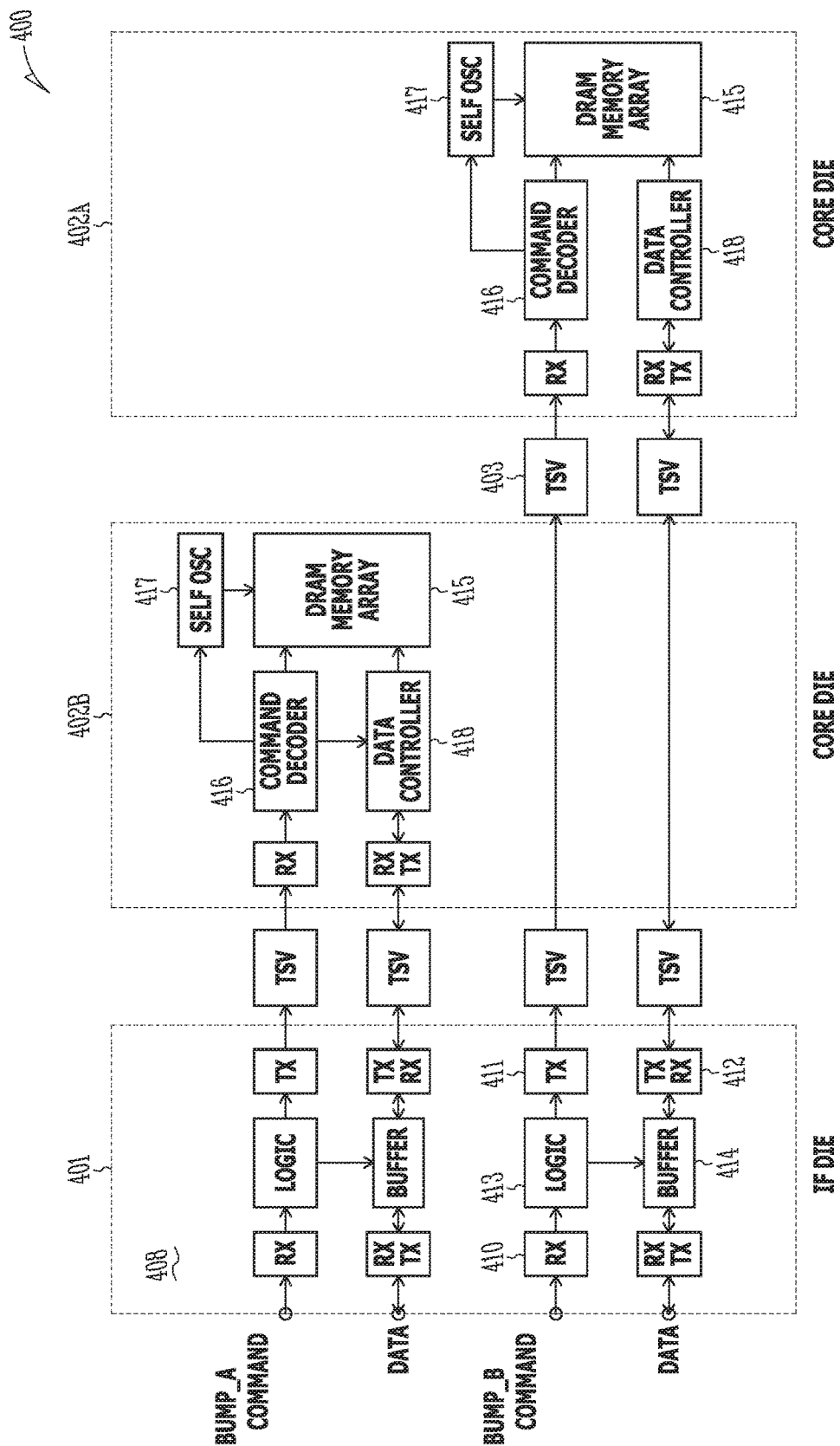
FIG. 4 illustrates an example of a high bandwidth memory according to a second embodiment.

FIG. 4 illustrates a first example of a HBM 400 according to a second embodiment. As shown in FIG. 4, the HBM 400 may include an interface die 401, and a stack of core dice 402 (such as core die 402A and core die 402B), which are connected to each other by TSVs 403.

In some embodiments, the interface die 401 may include bumps 404 (such as bump_A and bump_B), and internal circuits 408 (which may have receivers (Rx) 410, transmitters (Tx) 411, transceivers (Tx Rx) 412, logic 413, and buffers 414).

In some embodiments, the core die 402A may include memory cells located in a DRAM memory array 415, a command decoder 416, a self refresh oscillator 417, and a data controller 418. Similarly, the core die 402B may include memory cells located in a DRAM memory array 415, a command decoder 416, a self refresh oscillator 417, and a data controller 418. The core die 402A and the core die 402B may operate on commands respectively, and may thus work independently from each other.

Figure 5:
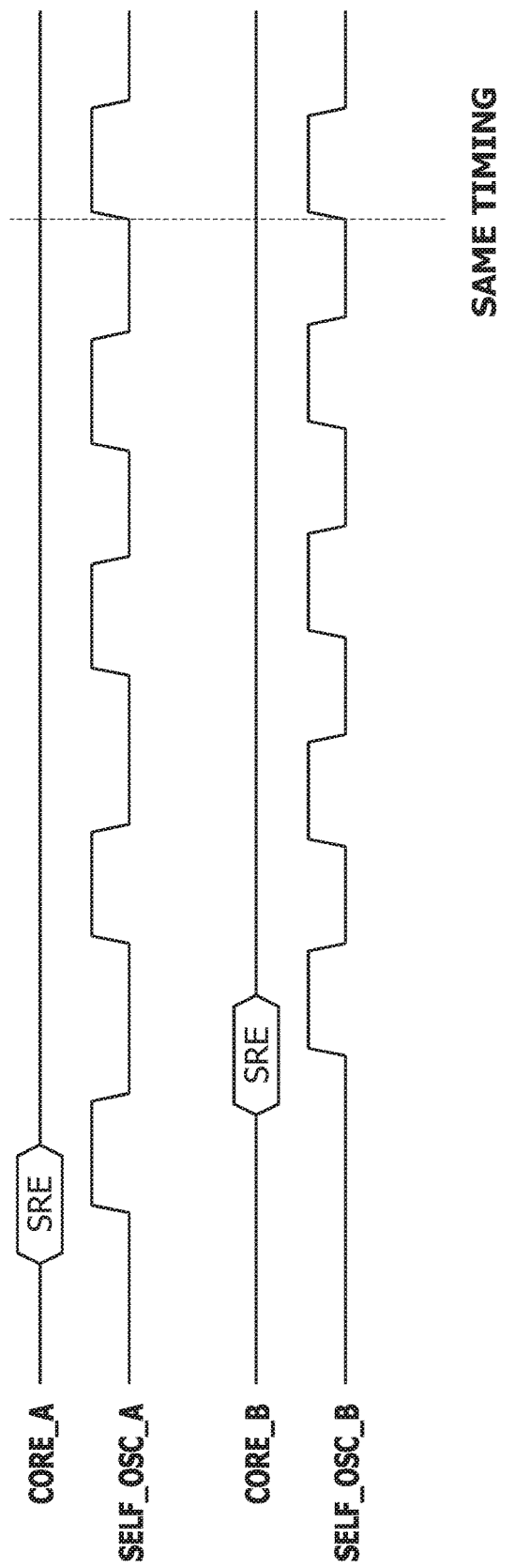
FIG. 5 illustrates an example of self-refresh timing according to the second embodiment.
Figure 6:
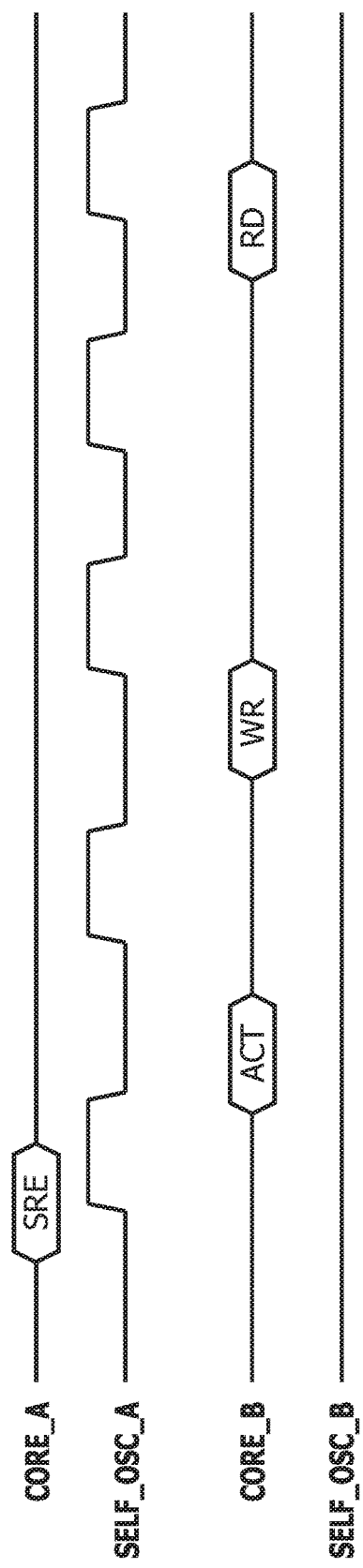
FIG. 6 illustrates another example of self-refresh timing according to the second embodiment.

FIG. 5 illustrates an example of self-refresh timing when both the core A and the core B as shown in FIG. 4 are in a self-refresh state according to the second embodiment. FIG. 6 illustrate another example of self-refresh timing when the core A as shown in FIG. 4 is in a self-refresh state and the core B as shown in FIG. 4 is not in a self-refresh state according to the second embodiment. In FIG. 5 and FIG. 6, self_osc represents a Self Refresh Oscillator signal, ACT represents an Active Command (which can be provided by a GPU), WR represents a WRITE signal, and RD represents a READ signal.

A DRAM die 102 A has a self refresh function and a DRAM die 102B also has a refresh function. The refresh function may be known as a self refresh mode of a DRAM. In self-refresh mode, the DRAM may automatically refresh the memory cell data, and all banks in the DRAM may be activated to refresh the memory cell data of the banks.

In the second embodiment, refresh operations of the two dice 102A and 102B are performed independently of each other, and thus those two refresh operation may sometimes occur simultaneously, which may be indicated as same timing in FIG. 5. Therefore, consumption current in the same timing of refresh operations of two dice 102A and 102B may become higher than consumption current in different timing of refresh operations. So to speak, peak current in the second embodiment HBM may sometimes become high in the same timing refresh operations. The DRAM dice of HMB may consume a large amount of power at the same time, and thus may induce power noise, possibly affecting the integrity of the self refresh function.

FIG. 7 illustrates an example of a HBM 700 according to the first embodiment. The explanations above may be applicable and/or identical at least in part to the first embodiment, and thus for simplicity, some common explanations are omitted. For example, the configurations shown above may be referred here according to the first embodiment.

As shown in FIG. 7, the HBM 700 may include an interface die 701, and a stack of core dice 702 (includes at least two dice such as a core die 702A and a core die 702B), which are connected to each other by TSVs 703.

In some embodiments, the interface die 701 may include bumps 704 (such as a bump_A and a bump_B), and internal circuits 708. The internal circuits 708 of the interface die 701 may include a self refresh oscillator 717, receivers 710, transmitters 711, transceivers 712, logic 713, and buffers 714.

Here, in some embodiments, the self refresh oscillator 717 may be located in the interface die 701, and may work in common with both the core die 702A and the core die 702B. In contrast, a self refresh oscillator 427 is not located in the interface die 401 and is located in each of dice 401A and 402B in FIG. 4 Thus, in the second embodiment, refresh operation may work independently of each other. According to the first embodiment, the self refresh oscillator 717 is configured common to stack of die including dice 702A and 702B.

In some embodiments, the self-refresh oscillator 717 may be activated according to a reset signal when the HBM 700 is not in a reset state for example.

In some embodiments, the core die 702A may include memory cells located in a DRAM memory array 715, a command decoder 716, a data controller 718, and a delay adjust circuit 719A. Similarly, the core die 702B may include memory cells located in a DRAM memory array 715, a command decoder 716, a data controller 718, and a delay adjust circuit 719B. The core die 702A and the core die 702B may operate on commands respectively, and thus may work independently of each other.

Here, according to the first embodiment, the delay adjust circuit 719A of the core die 702A and the delay adjust circuit 719B of the core die 702B are coupled in series to each other. In such an arrangement, a delay amount of the delay adjust circuit 719A may be configured to be the same as a delay amount of the delay adjust circuit 719B, and the delay adjust circuits 719A and 719B may be configured to be identical to each other.

According to the first embodiment, the refresh timing of the channels may be different due to the delay adjust circuits 719 (such as the delay adjust circuit 719A and the delay adjust circuit 719B), and thus a peak current consumption of the associated semiconductor device may be reduced.

Figure 8:
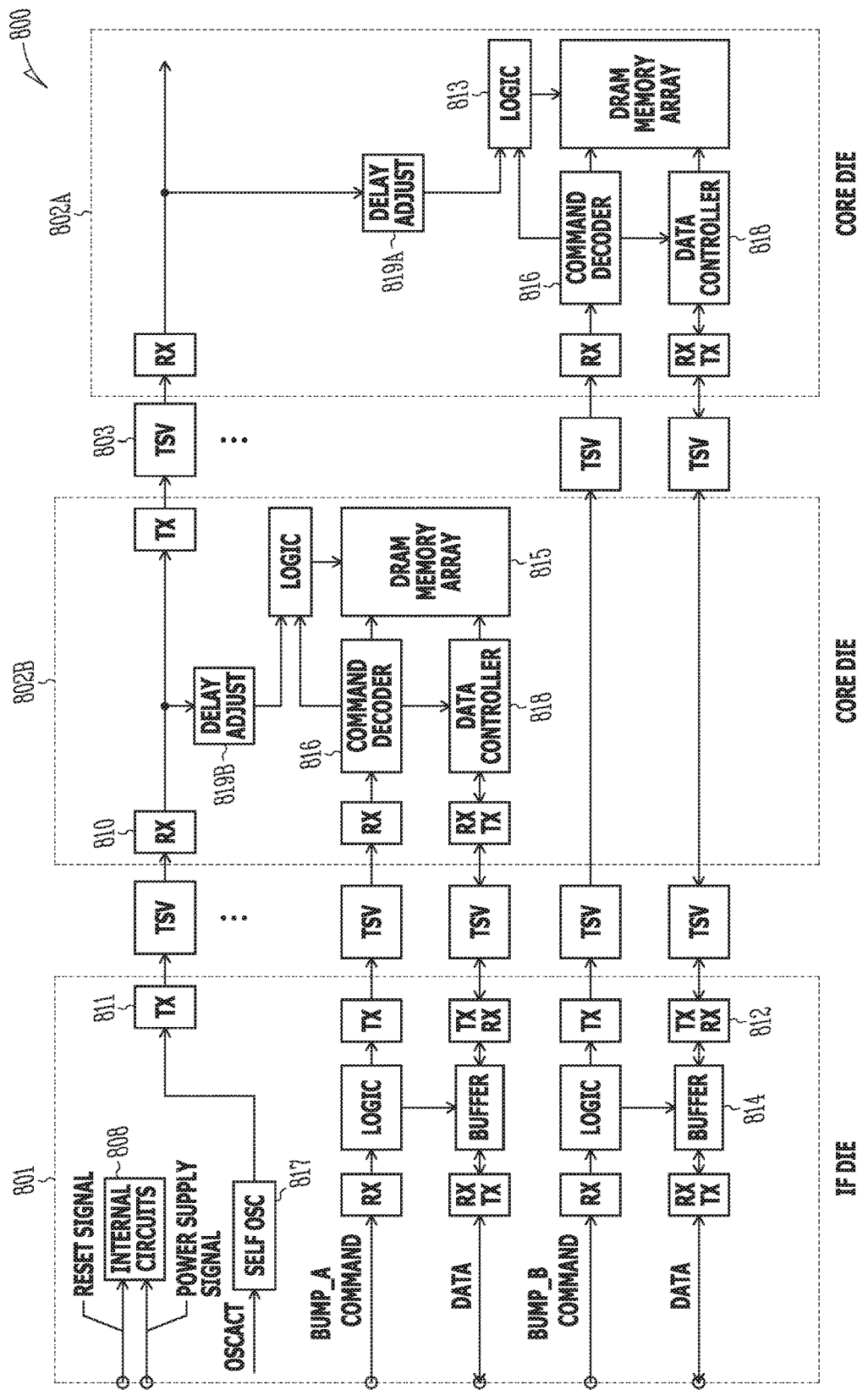
FIG. 8 illustrates a third example of a high bandwidth memory according to a third embodiment.

FIG. 8 illustrates a third example of a HBM 800 according to a third embodiment. As shown in FIG. 8, the HBM 800 may include an interface die 801, and a stack of core dice 802 (includes at least two dice such as a core die 802A and a core die 802B), which are connected to each other by TSVs 803. The explanations above may be applicable and/or identical at least in part to the third embodiment, and thus for simplicity, some common explanations are omitted. For example, the configurations shown above may be referred here according to the third embodiment.

In some embodiments, the interface die 801 may include bumps (such as a bump_A and a bump_B), and internal circuits 808. The internal circuits of the interface die 801 may include a self refresh oscillator 817, receivers 810, transmitters 811, transceivers 812, logic 813, and buffers 814.

In some embodiments, the core die 802A may include memory cells located in a DRAM memory array 815, a command decoder 816, a data controller 818, and a delay adjust circuit 819A. Similarly, the core die 802B may include memory cells located in a DRAM memory array 815, a command decoder 816, and a data controller 818, and a delay adjust circuit 819B. The core die 802A and the core die 802B may operate on commands respectively, and thus may work independently of each other.

According to the second embodiment, the delay adjust circuit 819A of the core die 802A and the delay adjust circuit 819B of the core die 802B are coupled in parallel to each other. In such an arrangement, a delay amount of the delay adjust circuit 819A may be different from a delay amount of the delay adjust circuit 819B, and the delay adjust circuits 819A and 819B may be configured to be different from each other.

According to the second embodiment, the refresh timing of the channels may be different due to the delay adjust circuits 819 (such as the delay adjust circuit 819A and the delay adjust circuit 819B), and thus a peak current consumption of the associated semiconductor device may be reduced.

Figure 9:
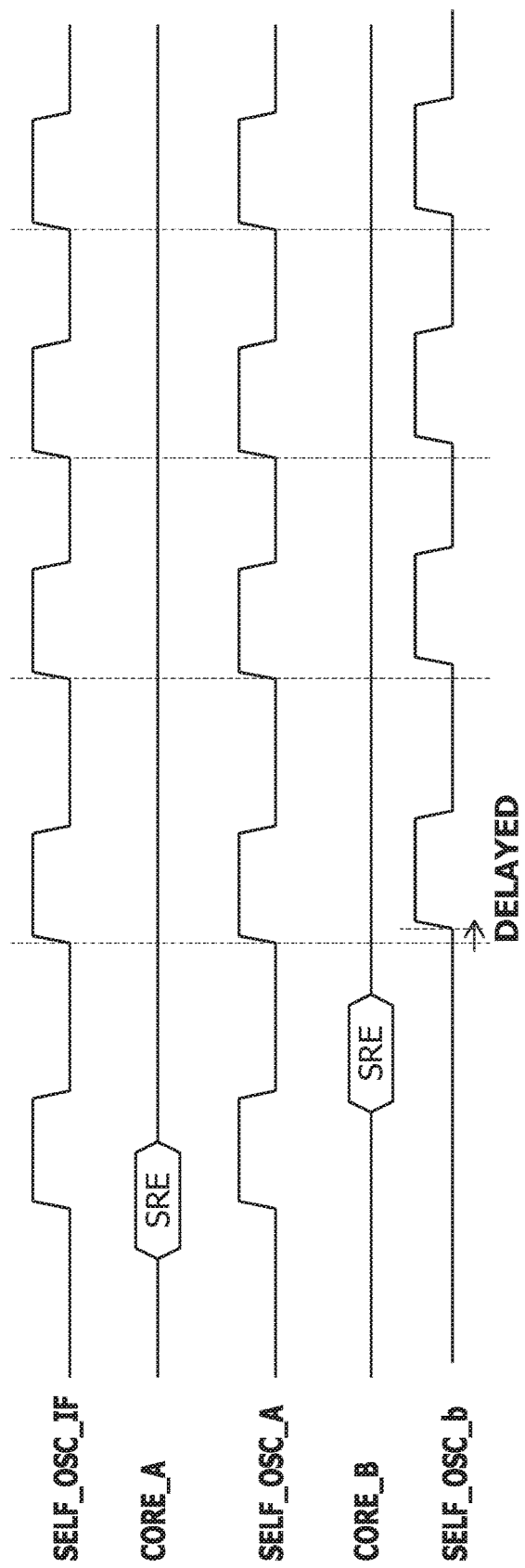
FIG. 9 illustrates an example of a self-refresh timing according to the first embodiment.

FIG. 9 illustrates an example of a-self refresh timing according to the first embodiment. The timing in FIG. 9 may be also referred according to other embodiments.

As shown in FIG. 9, two self refresh operations to the core die 102A and the core die 102B can be performed at different timing values due to the delay adjust circuits 119A and 119B for example.

According to the embodiments, two self oscillator singles SELF_OSC_A and SELF_OSC_B are commonly generated from one self oscillator signal SELF_OSC_IF and those two self oscillator singles SELF_OSC_A and SELF_OSC_B are triggered and activated to be high in different timing. Thus, simultaneous self-refresh operations of dice in stack can be prevented, and peak current in a self-refresh operation of HMB can be mitigated and become lower than the second embodiment.

Figure 10:
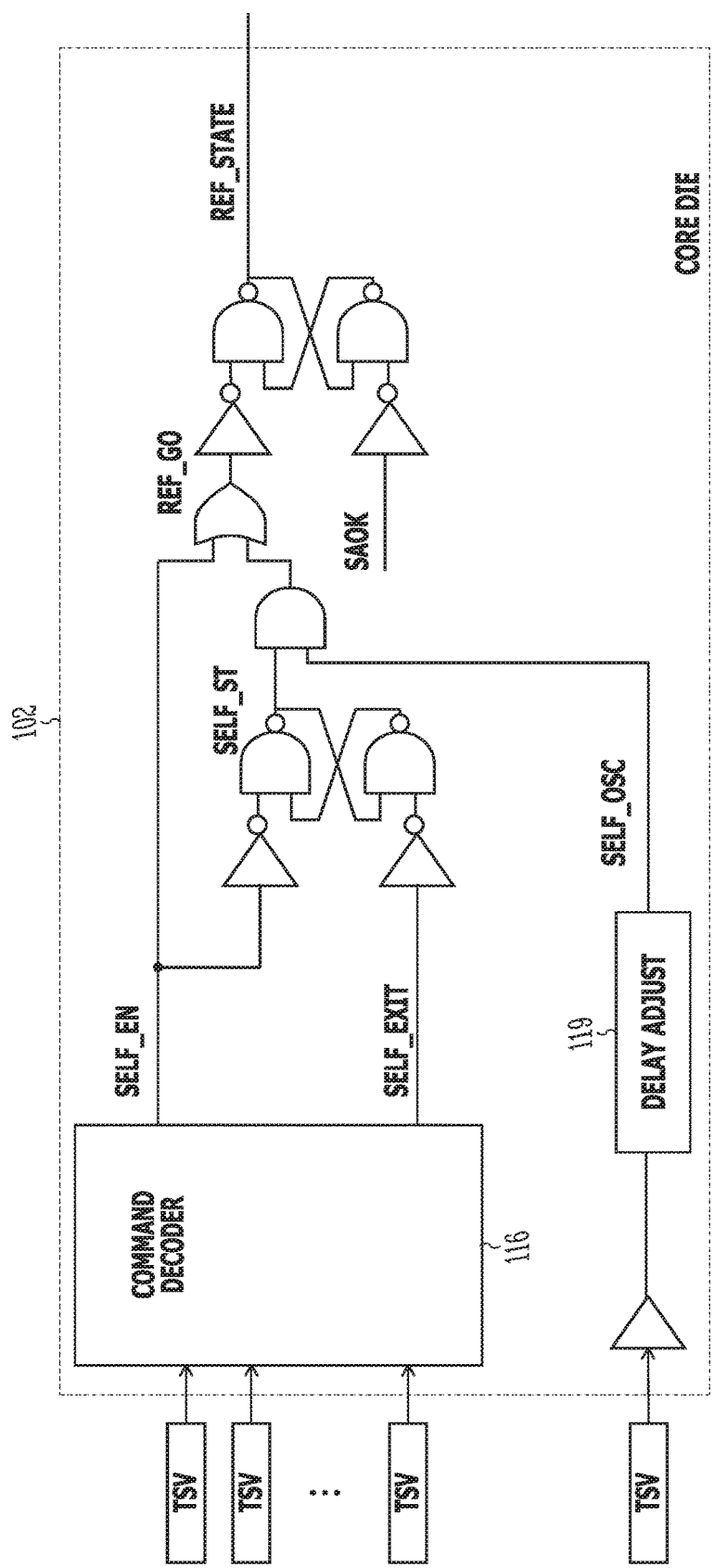
FIG. 10 illustrates an example of a core die according to the first embodiment.

FIG. 10 illustrates an example of a core die 102 according to the first embodiment. The configuration shown in FIG. 10 may be also referred according to other embodiments.

As shown in FIG. 10, the core die 102 (e.g., the core die 102A as shown in FIG. 8) may include a command decoder 116, and a delay adjust circuit 119. When any channel is in a self-refresh mode, a self oscillator signal may be driven to the core die 102. The delay adjust circuit 119 in the core die 102 may change a self refresh timing in each channel of the core die 102.

Figure 11:
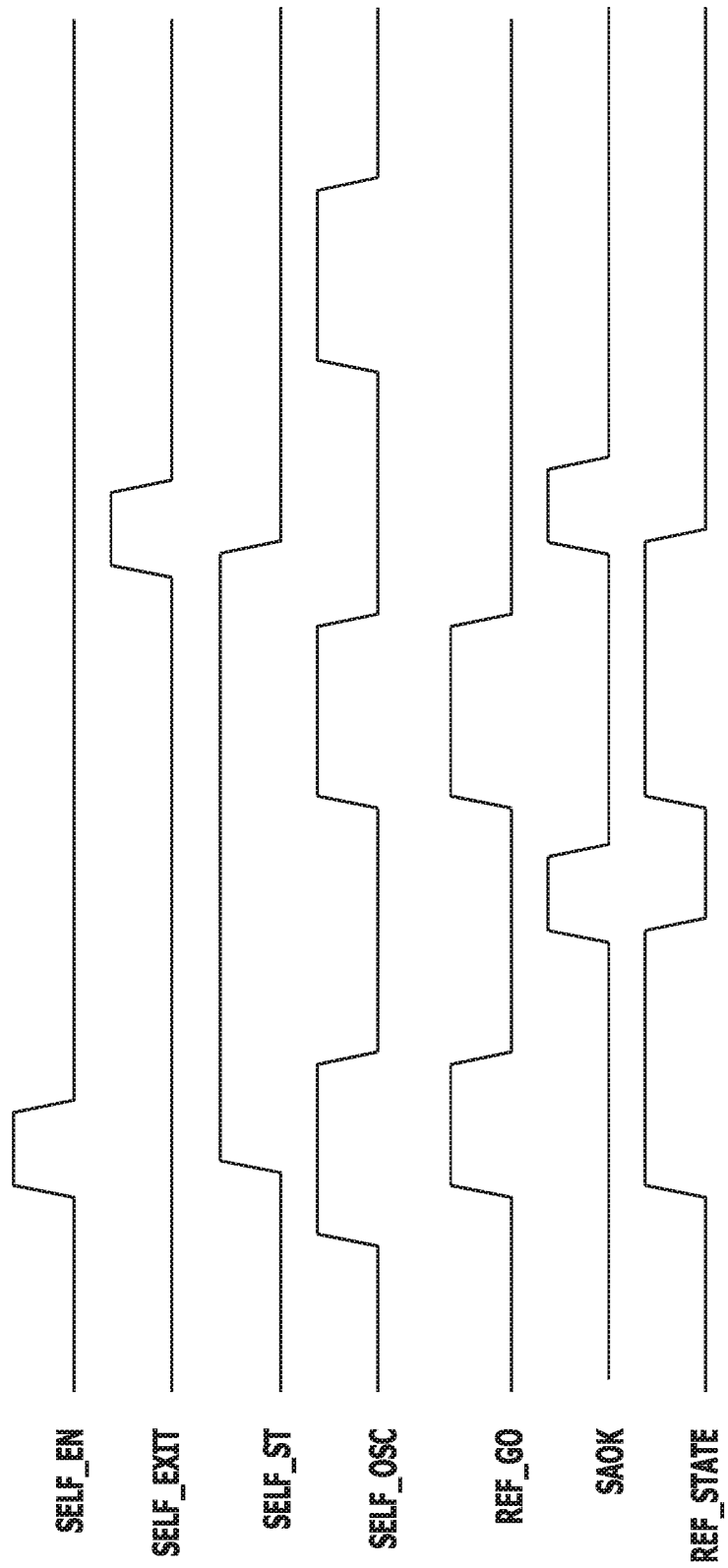
FIG. 11 illustrates an example of self-refresh waveforms in a core die according to the first embodiment.

FIG. 11 illustrates an example of refresh waveforms in a core die 102 according to the first embodiment. The waveform in FIG. 11 may be also referred according to other embodiments.

In FIG. 11, "self_en" represents a Self Refresh Entry signal, which may be provided by a GPU. "self_exit" represents a Self Refresh Exit signal, which may be provided by a GPU. "self_st" represents a Self Refresh State signal, which may go up from the "self_en" and go down from the "self_en". "self_osc" represents a Self Refresh Oscillator signal. "ref_go" represents a Refresh Start signal. "soak" represents a signal that is generated from a rising edge of the "ref_go". The "soak" signal may come from a memory array region, and may indicate that it is ok to finish the refresh operation. "ref_state" represents a Refresh Command (State) signal, which may go to a memory array region. The refresh operation may be started from a rising edge of the "ref_state", and may be finished at a falling edge of the "ref_state".

Figure 12:
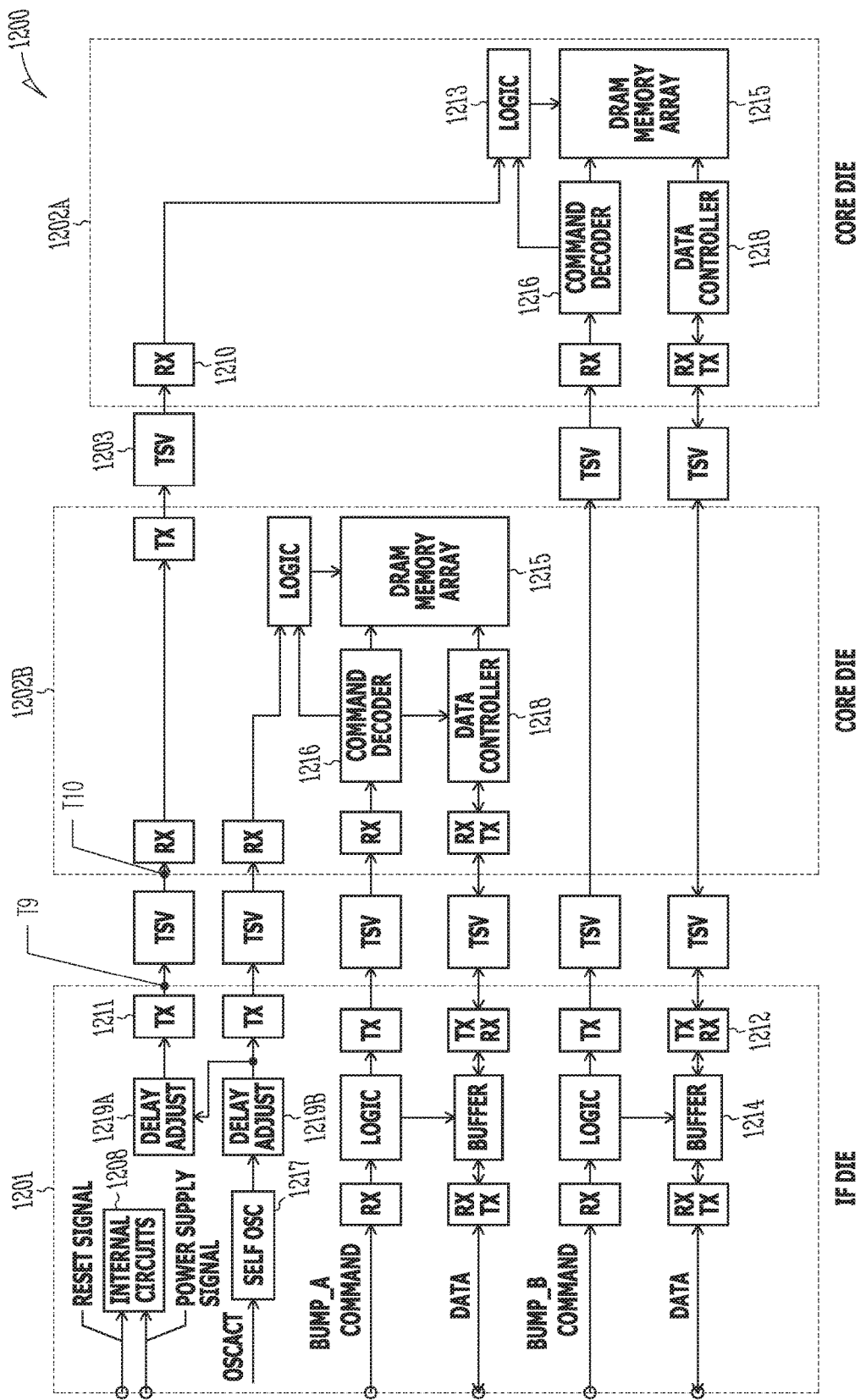
FIG. 12 illustrates a fourth example of a high bandwidth memory according to a fourth embodiment.

FIG. 12 illustrates an example of a HBM 1200 according to a fourth embodiment. The explanations above may be applicable and/or identical at least in part to the fourth embodiment, and thus for simplicity, some common explanations are omitted. For example, the configurations shown above may be referred here according to the fourth embodiment.

As shown in FIG. 12, the HBM 1200 may include an interface die 1201, and a stack of core dice 1202 (such as a core die 1202A and a core die 1202B), which are connected to each other by TSVs 1203.

In some embodiments, the interface die 1201 may include bumps (such as a bump_A and a bump_B), and internal circuits 1208. The internal circuits 1208 of the interface die 1201 may include a self refresh oscillator 1217, a delay adjust circuit 1219A, a delay adjust circuit 1219B, receivers 1210, transmitters 1211, transceivers 1212, logic 1213, and buffers 1214. The delay adjust circuit 1219A may receive a "self_osc" signal from the self-refresh oscillator 1217 for example.

Here, according to the fourth embodiment, a delay adjust circuit 1219A and a delay adjust circuit 1219B are located in the interface die 1201. In contrast, a delay adjust circuit 1219A and a delay adjust circuit 1219B are not located in the interface die 1201, and are located in core dice, respectively.

According to the fourth embodiment, the delay adjust circuit 1219A may be coupled to the core die 1202A. The delay adjust circuit 1219B may be coupled between the delay adjust circuit 1219A and the core die 1202B, and thus the delay adjust circuit 1219B may be coupled in series with the delay adjust circuit 1219A. In such an arrangement, the circuit layout area in each core die (such as the core die 1202A and the core die 1202B) may be reduced.

In some embodiments, the core die 1202A may include memory cells located in a DRAM memory array 1215, a command decoder 1216, and a data controller 1218. Similarly, the core die 1202B may include memory cells located in a DRAM memory array 1215, a command decoder 1216, and a data controller 1218. The core die 1202A and the core die 1202B may operate on command respectively, and thus may work independently of each other.

Figure 13:
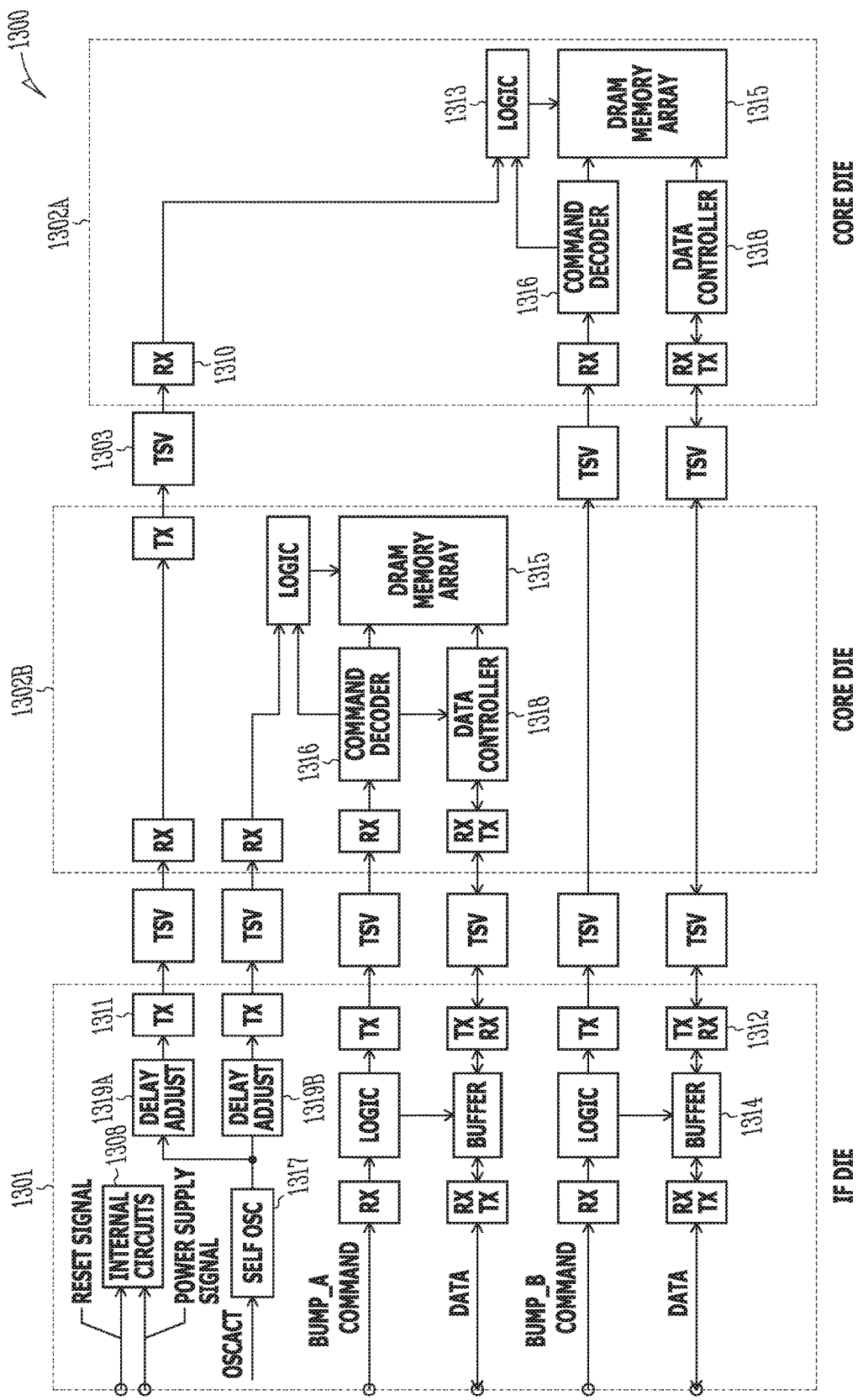
FIG. 13 illustrates a fifth example of a high bandwidth memory according to a fifth embodiment.

FIG. 13 illustrates a fifth example of a HBM 1300 according to a fifth embodiment. The explanations above may be applicable and/or identical at least in part to the fifth embodiment, and thus for simplicity, some common explanations are omitted. For example, the configurations shown above may be referred here according to the fifth embodiment.

As shown in FIG. 13, the HBM 1300 may include an interface die 1301, and a stack of core dice 1302 (such as a core die 1302A and a core die 1302B), which are connected to each other by TSVs 1303.

In some embodiments, the interface die 1301 may include bumps (such as a bump_A and a bump_B), and internal circuits 1308. The internal circuits 1308 of the interface die 1301 may include a self refresh oscillator 1317, a delay adjust circuit 1319A, a delay adjust circuit 1319B, receivers 1310, transmitters 1311, transceivers 1312, logic 1313, and buffers 1314.

Here, according to the fourth embodiment, a delay adjust circuit 1319A and a delay adjust circuit 1319B are located in the interface die 1301. In contrast, a delay adjust circuit 1319A and a delay adjust circuit 1319B are not located in the interface die 1301, and are located in core dice, respectively.

According to the fourth embodiment, the delay adjust circuit 1319A and the delay adjust circuit 1319B are coupled in parallel to each other, and may receive a "self_osc" signal from the self-refresh oscillator 1317 for example. The delay adjust circuit 1319A is coupled between the self refresh oscillator 1317 and the core die 1302A. The delay adjust circuit 1319B is coupled between the self-refresh oscillator 1317 and the core die 1302B.

In some embodiments, the core die 1302A may include memory cells located in a DRAM memory array 1315, a command decoder 1316, and a data controller 1318. Similarly, the core die 1302B may include memory cells located in a DRAM memory array 1315, a command decoder 1316, and a data controller 1318. The core dice 1302A and 1302B may operate on command respectively, and thus may work independently of each other.

In some embodiments, the delay adjust circuit 1319A of the interface die 1301 may be coupled to the DRAM memory array 1315 of the core die 1302A via elements (such as a transmitter 111 of the interface die 1301, a TSV 1303, a receiver 1310 of the core die 1302A, and logic 1313 of the core die 1302A in series). Similarly, the delay adjust circuit 1319B of the interface die 1301 may be coupled to the DRAM memory array 1315 of the core die 1302B via elements (such as a transmitter 1311 of the interface die 1301, a TSV 1303, a receiver 1310 of the core die 1302A, and logic 1313 of the core die 1302A in series).

In such an arrangement, an apparatus may only have one or more self refresh oscillators in an interface die, and the power consumption of the apparatus can be reduced.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. Thus the following claims are hereby incorporated into the Detailed Description, with each claim standing on its own as a separate embodiment.

What is claimed is:

1. An apparatus comprising:
a chip stack structure comprising a first memory chip and a second memory chip stacked over the first memory chip; and
an interface chip coupled to the chip stack structure,
wherein the interface chip is configured to transfer a first input clock signal based on an original clock signal to the first memory chip, and a second input clock signal based on the original clock signal to the second memory chip, and to independently transfer a first command signal to the first memory chip and a second command signal to the second memory chip, and wherein the interface chip further comprises an oscillator configured to produce the original clock signal.

2. The apparatus of claim 1,
wherein the first memory chip is configured to perform a first refresh operation on a plurality of first memory cells in response to the first input clock signal and the first command signal; and
wherein the second memory chip is configured to perform a second refresh operation on a plurality of second memory cells in response to the second input clock signal and the second command signal.

3. An apparatus comprising:
a chip stack structure comprising a first memory chip and a second memory chip stacked over the first memory chip; and
an interface chip coupled to the chip stack structure,
wherein the interface chip is configured to transfer a clock signal to both of the first memory chip and the second memory chip, and to independently transfer a first command signal to the first memory chip and a second command signal to the second memory chip,
wherein the interface chip comprises a first terminal supplied with the first command signal and a second terminal supplied with the second command signal;
wherein the first memory chip comprises a third terminal coupled to the first terminal and a fourth terminal coupled to the second terminal; and
wherein the second memory chip comprises a fifth terminal coupled to the second terminal by way of the fourth terminal.

4. The apparatus of claim 1, wherein the interface chip comprises a first terminal supplied with the first input clock signal;
wherein the first memory chip comprises a second terminal coupled to the first terminal; and
wherein the second memory chip comprises a third terminal coupled to the first terminal by way of the second terminal.

5. The apparatus of claim 1, wherein the interface chip comprises a first terminal supplied with the first input clock signal and a second terminal supplied with the second input clock signal having a different amount of delay from the first input clock signal at the first terminal;
wherein the first memory chip comprises a third terminal coupled to the first terminal and a fourth terminal coupled to the second terminal; and
wherein the second memory chip comprises a fifth terminal coupled to the second terminal by way of the fourth terminal.

6. An apparatus comprising:
a chip stack structure comprising a first memory chip and a second memory chip stacked over the first memory chip; and
an interface chip coupled to the chip stack structure,
wherein the first memory chip comprises a first command decoder circuit, a first terminal to receive a first clock signal, a second terminal coupled to the first command decoder circuit, and a plurality of first memory cells,
wherein the second memory chip comprises a second command decoder circuit, a third terminal to receive a second clock signal, a fourth terminal coupled to the second command decoder circuit, a fifth terminal, and a plurality of second memory cells,
wherein the second terminal of the first memory chip is electrically pled to the fifth terminal of the second memory chip, and
wherein the interface chip comprises sixth, seventh, and eighth terminals respectively electrically coupled to the third, fourth and fifth terminals of the second memory chips.

7. The apparatus of claim 6, wherein the interface chip comprises an oscillator to produce an oscillation signal at the sixth terminal, and wherein the first terminal of the first chip is electrically coupled to the third terminal of the second chip.

8. The apparatus of claim 6, wherein the interface chip comprises a ninth terminal and an oscillator to respectively produce a first oscillation signal at the sixth terminal and a second oscillation signal at the ninth terminal, and wherein the second chip comprises a tenth terminal electrically coupled to the ninth terminal of the interface chip and the first terminal of the first chip.

9. The apparatus of claim 7,
wherein the first memory cells are refreshed in response to the first clock signal at the first terminal when the first command decoder circuit receives a first refresh command, and
wherein the second memory cells are refreshed in response to the second clock signal at the third terminal when the second command decoder circuit receives a second refresh command.

10. An apparatus, comprising:
a chip stack structure comprising a first memory chip and a second memory chip stacked over the first memory chip;
an interface chip coupled to the chip stack structure, wherein the interface chip is configured to generate a clock signal and to transfer the clock signal to both of the first memory chip and the second memory chip, and to independently transfer a first command signal to the first memory chip to facilitate a first data refresh operation on the first memory chip, and a second command signal to the second memory chip to facilitate a second data refresh operation on the second memory chip;
a first delay circuit introducing a first delay of the clock signal utilized for the first refresh operation on the first memory chip relative to the clock signal generated on the interface chip; and
a second delay circuit introducing a second delay of the clock signal utilized for the second refresh operation on the second memory chip relative to the clock signal generated on the interface chip, wherein each of the first and second delay circuits is located on the interface chip.

11. The apparatus of claim 10, wherein the first delay circuit is located on the first memory chip; and wherein the second delay circuit is located on the second memory chip.

12. A method, comprising:
generating an original clock signal on an interface chip through use of an oscillator on the interface chip, wherein the interface chip is coupled to a chip stack structure comprising a first memory chip and a second memory chip stacked over the first memory chip;
activating the oscillator in response to a reset signal received by the interface chip;
establishing a first clock signal for use by the first memory chip, the first clock signal based on the original clock signal;
establishing a second clock signal for use by the second memory chip, the second clock signal based on the original clock signal;
transferring a first command signal from the interface chip to the first memory chip to facilitate performing a first data refresh operation on the first memory chip through use of the first clock signal; and
transferring a second command signal from the interface chip to the second memory chip to facilitate performing of a second data refresh operation on the second memory chip through use of the second clock signal.

13. The method of claim 12,
wherein the first clock signal is delayed by a first interval relative to the original clock signal; wherein the second clock signal is delayed by a second interval relative to the original clock signal; and
wherein the first interval is different from the second interval.

14. The method of claim 13,
wherein the original clock signal is communicated to each of the first memory chip and the second memory chip;
wherein the original clock signal is delayed on the first memory chip to establish the first clock signal; and
wherein the original clock signal is delayed on the second memory chip to establish the second clock signal.

15. The method of claim 12, wherein the interface chip is stacked with the chip stack structure.

* * * * *